United States Patent
Shi

(10) Patent No.: US 11,403,999 B2
(45) Date of Patent: Aug. 2, 2022

(54) DISPLAY PANEL AND CONTROL METHOD THEREOF

(71) Applicant: WUHAN CHINA STAR OPTOELECTRONICS TECHNOLOGY CO., LTD., Hubei (CN)

(72) Inventor: Tengteng Shi, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 301 days.

(21) Appl. No.: 16/756,140

(22) PCT Filed: Mar. 24, 2020

(86) PCT No.: PCT/CN2020/080931
§ 371 (c)(1),
(2) Date: Apr. 15, 2020

(87) PCT Pub. No.: WO2021/168955
PCT Pub. Date: Sep. 2, 2021

(65) Prior Publication Data
US 2022/0157235 A1    May 19, 2022

(30) Foreign Application Priority Data
Feb. 26, 2020   (CN) .......................... 202010120881.6

(51) Int. Cl.
*G06K 9/00*    (2022.01)
*G09G 3/3225*    (2016.01)
(Continued)

(52) U.S. Cl.
CPC .......... *G09G 3/3225* (2013.01); *G01J 1/4204* (2013.01); *G01V 8/10* (2013.01);
(Continued)

(58) Field of Classification Search
CPC .................. G09G 3/3225; G09G 3/36; G09G 2320/0626; G09G 2360/144;
(Continued)

(56) References Cited

U.S. PATENT DOCUMENTS

| 2017/0061193 A1 | 3/2017 | Young |
| 2017/0116454 A1 | 4/2017 | Slaby |
| 2019/0012512 A1* | 1/2019 | He ..................... G06V 40/1382 |

FOREIGN PATENT DOCUMENTS

| CN | 106886767 A | 6/2017 |
| CN | 107223203 A | 9/2017 |

(Continued)

*Primary Examiner* — Abdul-Samad A Adediran
(74) *Attorney, Agent, or Firm* — Dickinson Wright PLLC

(57) ABSTRACT

A display panel and a control method thereof are provided. The method includes steps of: providing a display panel; receiving light through a TFT photosensitive sensor and converting the light into an electrical signal, wherein the light includes at least one of ambient light and reflected light; converting the electrical signal into at least one of fingerprint information, proximity sensing information, and ambient light monitoring information through a driving chip; and providing an action signal to a display module according to at least one of the fingerprint information, the proximity sensing information, and the ambient light monitoring information to control action of the display module. The application uses a same sensor to implement optical fingerprint, ambient light monitoring, and proximity sensing functions.

13 Claims, 7 Drawing Sheets

(51) Int. Cl.
  *G02F 1/1368*  (2006.01)
  *G02F 1/1333*  (2006.01)
  *H01L 27/32*  (2006.01)
  *G06V 40/13*  (2022.01)
  *G01J 1/42*  (2006.01)
  *G01V 8/10*  (2006.01)
  *G06V 10/145*  (2022.01)
  *G06V 40/12*  (2022.01)
  *G09G 3/36*  (2006.01)

(52) U.S. Cl.
  CPC ........ *G02F 1/1368* (2013.01); *G02F 1/13338* (2013.01); *G06V 10/145* (2022.01); *G06V 40/1318* (2022.01); *G06V 40/1382* (2022.01); *H01L 27/3234* (2013.01); *G09G 3/36* (2013.01); *G09G 2320/0626* (2013.01); *G09G 2360/144* (2013.01)

(58) Field of Classification Search
  CPC .... G06V 40/1318; G06V 10/145; G06V 8/10; G06V 40/1382; G01J 1/4204; G02F 1/13338; G02F 1/1368; H01L 27/3234
  See application file for complete search history.

(56) References Cited

FOREIGN PATENT DOCUMENTS

| | | |
|---|---|---|
| CN | 108376686 A | 8/2018 |
| CN | 109786433 A | 5/2019 |
| CN | 110690227 A | 1/2020 |

\* cited by examiner

DISPLAY PANEL AND CONTROL METHOD THEREOF

CROSS REFERENCE TO RELATED APPLICATION

This application claims priority to a Chinese patent application filed with the China National Intellectual Property Administration on Feb. 26, 2020, with an application number of 202010120881.6, and a disclosure name is "DISPLAY PANEL AND CONTROL METHOD THEREOF", an entire contents of which are incorporated herein by reference.

FIELD OF DISCLOSURE

The present disclosure relates to displays, and more particularly to a display panel and a control method thereof.

BACKGROUND OF DISCLOSURE

Consumer electronics devices, such as mobile phones and tablets, are using more and more sensors to enhance their ability to sense various environmental parameters. Fingerprint sensors, ambient light sensors and distance sensors have been widely used. However, these sensors are usually manufactured independently in electronic products, which not only increases manufacturing cost, but also reduces integration of electronic components.

Therefore, it is necessary to provide a display panel and a control method thereof to solve problems existing in the prior art.

SUMMARY OF DISCLOSURE

From above, the present disclosure provides a display panel and a control method thereof to solve problems of increasing manufacturing costs and reducing integration of electronic components in the prior art.

A main object of the present disclosure is to provide a display panel and a control method thereof, which convert light into electrical signals through a TFT photosensitive sensor and convert the electrical signals into at least one of fingerprint information, proximity sensing information, and ambient light monitoring information, so as to reduce a production cost and improve an integration degree of electronic components.

To achieve the above object of the present disclosure, an embodiment of the present disclosure provides a display panel comprising: a display module, a photosensitive module, and an application module. The photosensitive module is disposed on a surface of the display module, wherein the photosensitive module comprises a plurality of light-path units disposed with intervals, a TFT photosensitive sensor, and a driving chip. The TFT photosensitive sensor is disposed on the plurality of light-path units, wherein the TFT photosensitive sensor receives a light passing through between the plurality of light-path units and converts the light into an electrical signal, wherein the light includes at least one of an ambient light and a reflected light. The driving chip is electrically connected to the TFT photosensitive sensor, wherein the driving chip converts the electrical signal into at least one of a fingerprint information, a proximity sensing information, and an ambient light monitoring information. The application module is electrically connected to the display module and the photosensitive module, wherein the application module provides an action signal to the display module to control the action of the display module, according to at least one of the fingerprint information, the proximity sensing information, and the ambient light monitoring information.

In an embodiment of the present disclosure, the display module is a self-luminous panel, wherein an incident light is emitted from the self-luminous panel and is reflected to form the reflected light.

In an embodiment of the present disclosure, the display panel further comprises a backlight module disposed on the TFT photosensitive sensor, wherein an incident light is emitted from the backlight module and is reflected to form the reflected light.

To achieve the above object of the present disclosure, an embodiment of the present disclosure provides a display panel comprising: a display module, a photosensitive module, and an application module. The photosensitive module is disposed on a surface of the display module, wherein the photosensitive module comprises a light-path unit, a TFT photosensitive sensor, and a driving chip. The TFT photosensitive sensor is disposed on the light-path unit, wherein the TFT photosensitive sensor receives a light and converts the light into an electrical signal, wherein the light includes at least one of an ambient light and a reflected light. The driving chip is electrically connected to the TFT photosensitive sensor, wherein the driving chip converts the electrical signal into at least one of a fingerprint information, a proximity sensing information, and an ambient light monitoring information. The application module is electrically connected to the display module and the photosensitive module, wherein the application module provides an action signal to the display module to control the action of the display module, according to at least one of the fingerprint information, the proximity sensing information, and the ambient light monitoring information.

In an embodiment of the present disclosure, the display module is a self-luminous panel, wherein an incident light is emitted from the self-luminous panel and is reflected to form the reflected light.

In an embodiment of the present disclosure, the display panel further comprises a backlight module disposed on the TFT photosensitive sensor, wherein an incident light is emitted from the backlight module and is reflected to form the reflected light.

Further, another embodiment of the present disclosure provides a control method of a display panel comprising steps of: providing a display panel, wherein the display panel comprises a display module, a photosensitive module, and an application module, wherein the application module is connected with the display module and the photosensitive module; receiving a light through a TFT photosensitive sensor of the photosensitive module and converting the light into an electrical signal, wherein the light includes at least one of an ambient light and a reflected light; converting the electrical signal into at least one of a fingerprint information, a proximity sensing information, and an ambient light monitoring information through a driving chip of the photosensitive module; and providing, by the application module, an action signal to the display module according to at least one of the fingerprint information, the proximity sensing information, and the ambient light monitoring information to control an action of the display module.

In an embodiment of the present disclosure, the display module is a self-luminous panel, wherein an incident light is emitted from the self-luminous panel and is reflected to form the reflected light.

In an embodiment of the present disclosure, the display panel further comprises a backlight module disposed on the TFT photosensitive sensor, wherein an incident light is emitted from the backlight module and is reflected to form the reflected light.

In an embodiment of the present disclosure, the light includes at least one fingerprint valley reflection light and at least one fingerprint crest reflection light, wherein the driving chip converts the electrical signal into the fingerprint information.

In an embodiment of the present disclosure, the light includes the ambient light and the reflected light, and the driving chip converts the electrical signal into the proximity sensing information.

In an embodiment of the present disclosure, the light includes the ambient light, wherein the driving chip converts the electrical signal into the ambient light monitoring information.

In an embodiment of the present disclosure, the driving chip analyzes the light in a time-division manner.

Compared with the prior art, the display panel and the control method of the present disclosure convert light into electrical signals through a TFT light sensor, and convert the electrical signals into at least one of fingerprint information, proximity sensing information, and the ambient light monitoring information, so as to reduce a production cost and improve an integration degree of electronic components.

In order to make the above content of the present disclosure more comprehensible, in the following, the preferred embodiments are specifically described and described in detail with the accompanying drawings as follows:

DETAILED DESCRIPTION OF PREFERRED EMBODIMENTS

Following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, horizontal, vertical, longitudinal, axial, radial, an uppermost layer or a lowermost layer, etc., only refer to a direction of the accompanying figures. Therefore, the used directional terms are used to describe and understand the present disclosure, but the present disclosure is not limited thereto.

Figure 1A:
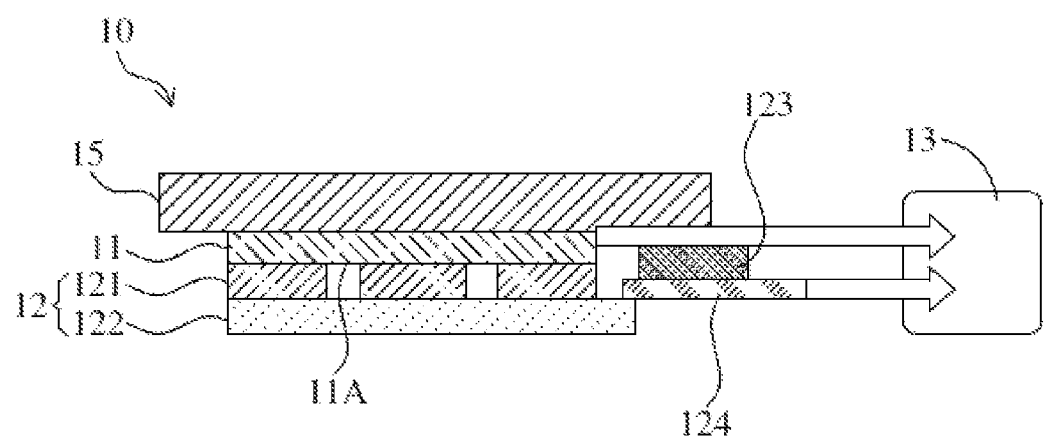
FIG. 1A is a schematic cross-sectional view of a display panel according to an embodiment of the present disclosure.
Figure 1B:
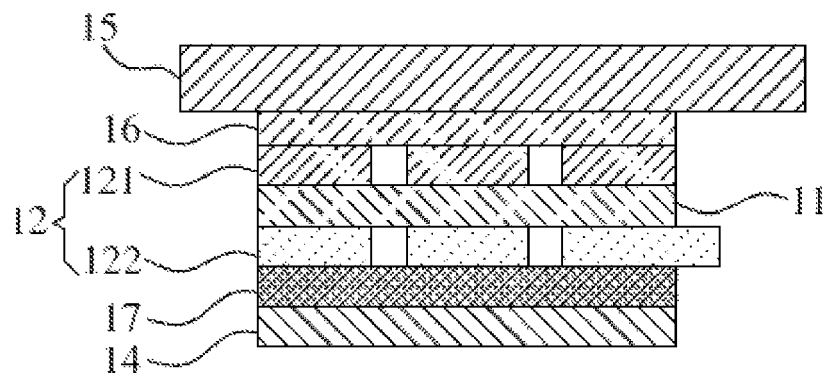
FIG. 1B is a schematic cross-sectional view of a display panel according to another embodiment of the present disclosure.
Figure 1C:
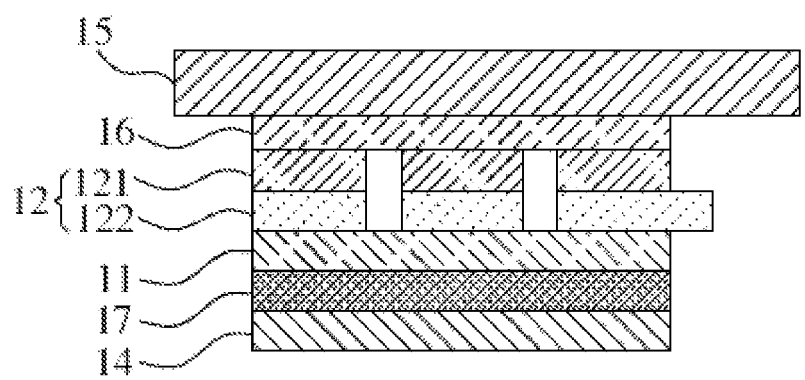
FIG. 1C is a schematic cross-sectional view of a display panel according to a further embodiment of the present disclosure.

Referring to FIG. 1A to FIG. 1C, FIG. 1A is a schematic cross-sectional view of a display panel 10 according to an embodiment of the present disclosure; FIG. 1B is a schematic cross-sectional view of a display panel 10 according to another embodiment of the present disclosure; and FIG. 1C is a schematic cross-sectional view of a display panel 10 according to a further embodiment of the present disclosure. For the sake of brevity, FIG. 1B and FIG. 1C do not show an application module and a driving chip. In an embodiment of the present disclosure, the display panel 10 mainly includes a display module 11, a photosensitive module 12, and an application module 13. The display module 11 can be used as a display screen for displaying images or videos.

As shown in FIG. 1A, according to an embodiment of the present disclosure, the photosensitive module 12 of the display panel 10 is disposed on a surface 11A of the display module 11. The photosensitive module 12 includes: a light-path unit 121, a TFT photosensitive sensor 122, and a driving chip 123. The light-path unit 121 is disposed on the surface 11A of the display module 11, which has a function of focusing light and removing noise from the screen. The TFT photosensitive sensor 122 is disposed on the light-path unit 121. The TFT photosensitive sensor 122 receives a light and converts the light into an electrical signal. The light includes at least one of an ambient light and a reflected light. The driving chip 123 is electrically connected to the TFT photosensitive sensor 122 (for example, through a flexible printed circuit board 124), wherein the driving chip 123 converts the electrical signal into at least one of a fingerprint information, a proximity sensing information, and an ambient light monitoring information. In an embodiment, the driving chip 123 has a function of converting an electrical signal into a digital signal. In an example, the driving chip 123 may compare the electrical signal with data of a database (not shown), and then determine that the electrical signal belongs to at least one of the fingerprint information, the proximity sensing information, and the ambient light monitoring information.

According to an embodiment of the present disclosure, an application module 13 of the display panel 10 is electrically connected to the display module 11 and the photosensitive module 12, wherein the application module 13 provides an action signal to the display module 11 to control the action of the display module 11, according to at least one of the fingerprint information, the proximity sensing information, and the ambient light monitoring information. For example, the application module determines whether it matches a preset fingerprint information according to the fingerprint information, and then determines whether to perform unlocking, and provides a corresponding operation signal to the display module 11. In an embodiment, the application module 13 can perform any function related to fingerprint operation according to the fingerprint information. For example, the preset fingerprint information is established in the database, etc.

In one embodiment, the application module 13 provides an action signal according to the proximity sensing information to control whether to enable or disable display function of the display module. Specifically, for example, in a case where the display panel is used as a display screen of a smart phone, when a user answers a call, the application module 13 may obtain a proximity sensing information (since the phone is close to the human ear) and close a display function of the display module.

In one embodiment, the application module 13 provides an action signal according to the ambient light monitoring information, and then adjusts display brightness of the display module 11. Specifically, for example, when a brightness of the ambient light is greater than a preset brightness in the database, the application module 13 provides an action signal of reducing the brightness to the display module 11, so as to adjust the display brightness of the display module 11 (Such as reducing display brightness).

From above, in the embodiment of the present disclosure, the display panel 10 mainly converts light into electrical signals through a TFT photosensitive sensor and converts the electrical signals into at least one of fingerprint information, proximity sensing information, and ambient light monitoring information through a driving chip, so as to reduce a production cost and improve an integration of electronic components.

In an embodiment, the display module 11 is a self-luminous panel, wherein an incident light is emitted from the self-luminous panel and is reflected to form the reflected light. In this embodiment, the display panel is, for example, an organic light emitting diode (OLED) panel, and the display panel 10 further includes, for example, a cover plate 15 as an outer layer protection effect of the display panel.

In an embodiment, the display panel 10 further comprises a backlight module 14 disposed on the TFT photosensitive sensor 122, wherein an incident light is emitted from the backlight module 14 and is reflected to form the reflected light. In this embodiment, the display panel 10 is, for example, a liquid crystal panel. The liquid crystal panel further includes, for example, a cover plate 15 and a color filter 16. In an example, the display module 11 of the liquid crystal panel can be a liquid crystal layer, and the liquid crystal layer is disposed between the light-path unit 121 and the TFT photosensitive sensor 122 (as shown in FIG. 1B). In another example, the liquid crystal layer 15 of the liquid crystal panel can be disposed on the TFT photosensitive sensor 122 (as shown in FIG. 1C). In another embodiment, the liquid crystal panel can further include an array substrate 17 disposed between the backlight module 14 and the TFT photosensitive sensor 122.

Figure 2:
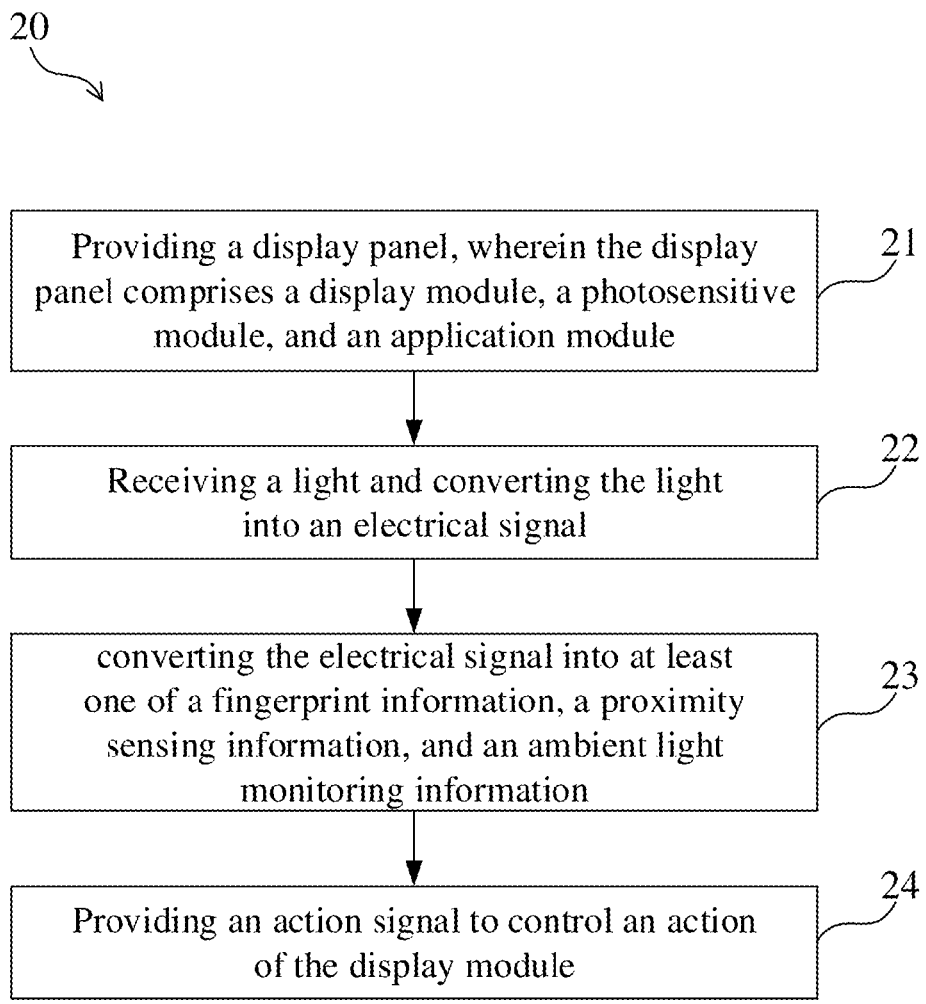
FIG. 2 is a flowchart of a control method of a display panel according to an embodiment of the present disclosure.

Referring to FIG. 2, in an embodiment of the present disclosure, a control method 20 of a display panel comprises steps 21 to 24 of: providing a display panel, wherein the display panel comprises a display module, a photosensitive module, and an application module, wherein the application module is connected with the display module and the photosensitive module (step 21); receiving a light through a TFT photosensitive sensor of the photosensitive module and converting the light into an electrical signal, wherein the light includes at least one of an ambient light and a reflected light (step 22); converting the electrical signal into at least one of a fingerprint information, a proximity sensing information, and an ambient light monitoring information through a driving chip of the photosensitive module (step 23); and providing, by the application module, an action signal to the display module according to at least one of the fingerprint information, the proximity sensing information, and the ambient light monitoring information to control an action of the display module (step 24).

In an embodiment, in the step 21, a display panel 10 is provided as an embodiment of the present disclosure.

In an embodiment, the display module is a self-luminous panel, wherein an incident light is emitted from the self-luminous panel and is reflected to form the reflected light.

In another embodiment, the display panel further comprises a backlight module disposed on the TFT photosensitive sensor, wherein an incident light is emitted from the backlight module and is reflected to form the reflected light.

Figure 3:
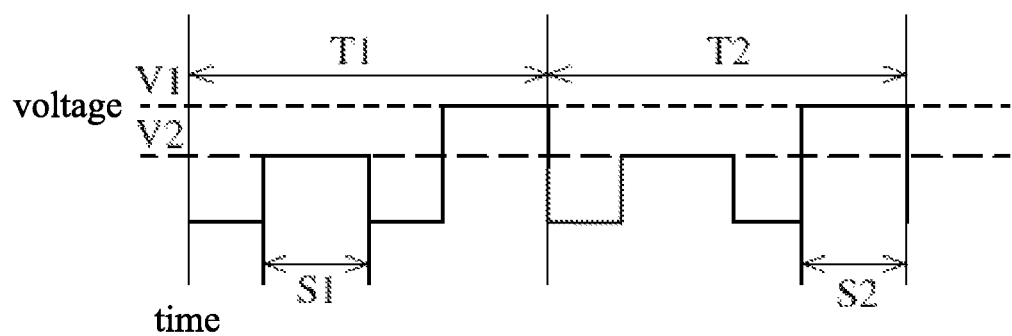
FIG. 3 is a schematic diagram of analyzing a light by a driving chip of a display panel according to an embodiment of the present disclosure.

In one embodiment, the driving chip analyzes the light in a time-division manner. For example, referring to FIG. 3, an electrical information S1 (with voltage value of V2) of the reflected light is analyzed in a period T1, and an electrical information S2 (with voltage value of V1) of the ambient light is analyzed in a period T2.

Several examples are given below for further explanation.

Figure 4A:
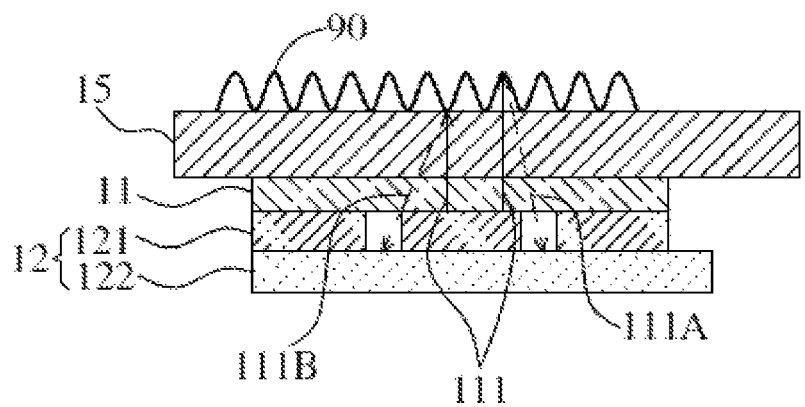
FIG. 4A is a schematic diagram of fingerprint recognition of a display panel according to an embodiment of the present disclosure.
Figure 4B:
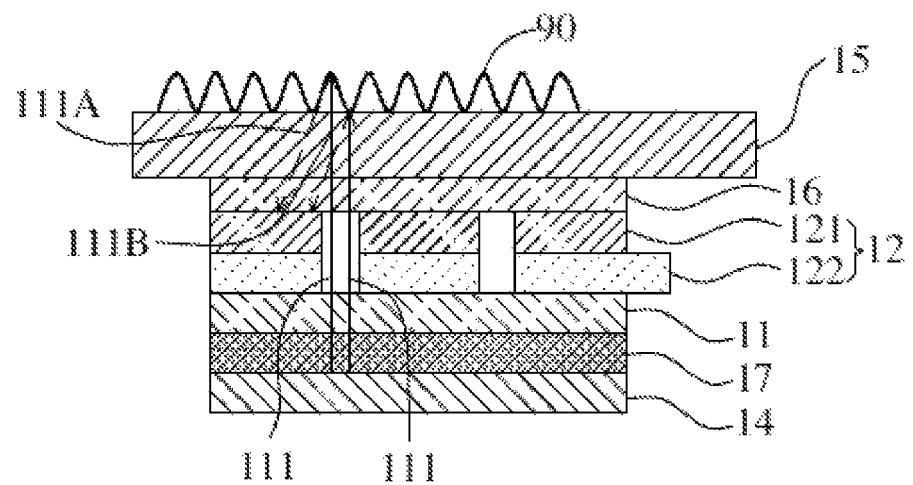
FIG. 4B is a schematic diagram of fingerprint recognition of a display panel according to another embodiment of the present disclosure.

Referring to FIG. 4A, the display panel is for example, an OLED panel. The display module 11 emits at least one incident light 111 to a finger, and at least one fingerprint valley reflected light 111A and at least one fingerprint crest reflection light 111B are formed after being reflected by a finger 90. The at least one fingerprint valley reflection light 111A and the at least one fingerprint crest reflection light 111B are received by the TFT photosensitive sensor 112 and are converted into an electrical signal. Then, the electrical signal is converted into fingerprint information by a driving chip (not shown in FIG. 4A) of the photosensitive module 12. A light intensity of the fingerprint crest reflected light 111B and a light-path of the fingerprint valley reflected light 111A of the fingerprint valley are not the same, where one occurs like a total reflection, and the other undergoes multiple refractions. The light intensity of the reflected light reaching the TFT photosensitive sensor 112 is different. The current generated in the TFT photosensitive sensor 112 will be different. The difference in current or voltage read by the driving chip, that is, the difference between the crest and the valley, so as to identify the crest and the valley of the fingerprint. On the other hand, when the display panel is for example, a liquid crystal panel (as shown in FIG. 4B), the at least one fingerprint valley reflected light 111A and the at least one fingerprint crest reflected light 111B are formed by an incident light emitted through the backlight module 14 after being reflected by the finger 90.

Figure 5A:
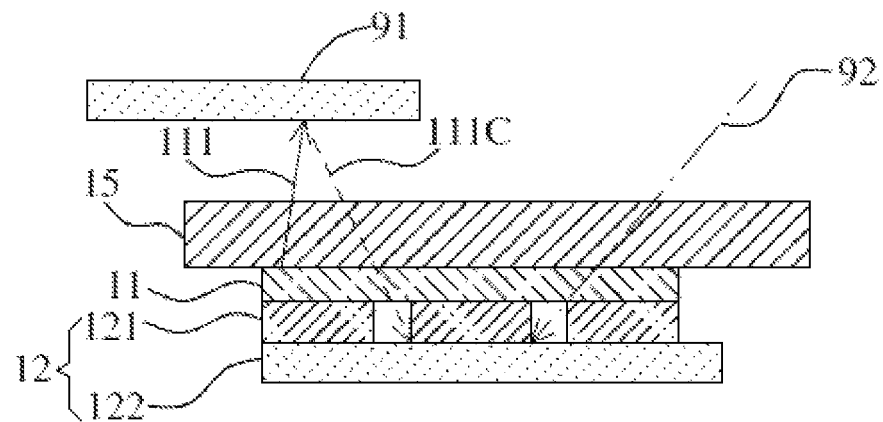
FIG. 5A is a schematic diagram of obstacle identification of a display panel according to an embodiment of the present disclosure.
Figure 5B:
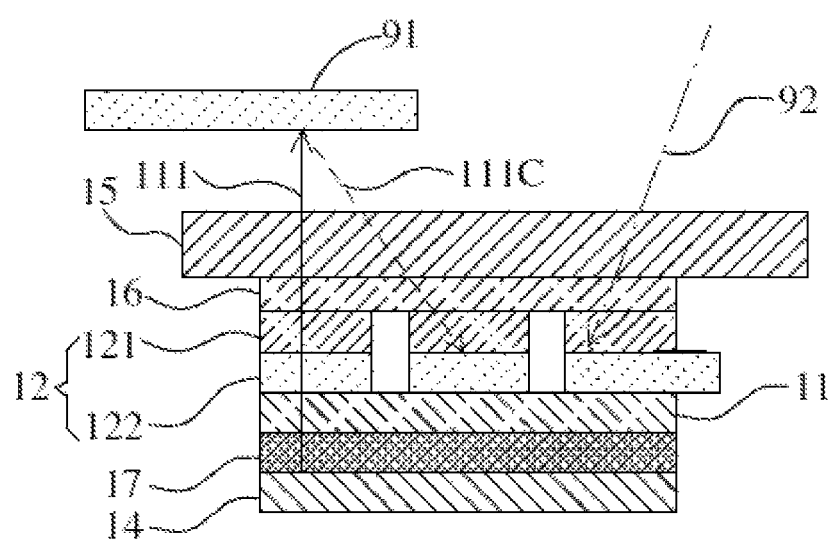
FIG. 5B is a schematic diagram of obstacle identification of a display panel according to another embodiment of the present disclosure.

Referring to FIG. 5A, the display panel is, for example, an OLED panel. At least one incident light 111 is emitted by the display module 11 to an obstacle 91 and is reflected by the obstacle 91 to form a reflected light 111C. Then, the reflected light 111C and an ambient light 92 are received by the TFT photosensitive sensor 112 and converted into an electrical signal. A driving chip (not shown in FIG. 5A) of the photosensitive module is used to convert the electrical signal into a proximity sensing information. At this time, a light intensity detected by the TFT photosensitive sensor 112 is composed of the reflected light 111C of the obstacle 91 and the ambient light 92. However, the light intensity of the reflected light 111C is much smaller than the ambient light 92, and an ambient light 92 in an obstacle area will be significantly smaller than an ambient light 92 in an area without obstacles. By comparison, it is determined whether there is an obstacle 91 so as to achieve a function of turning off screen when answering a call. On the other hand, in a case where the display panel is for example, a liquid crystal panel (as shown in FIG. 5B), an incident light is emitted from the backlight module and is reflected by an obstacle to form the reflected light.

Figure 6A:
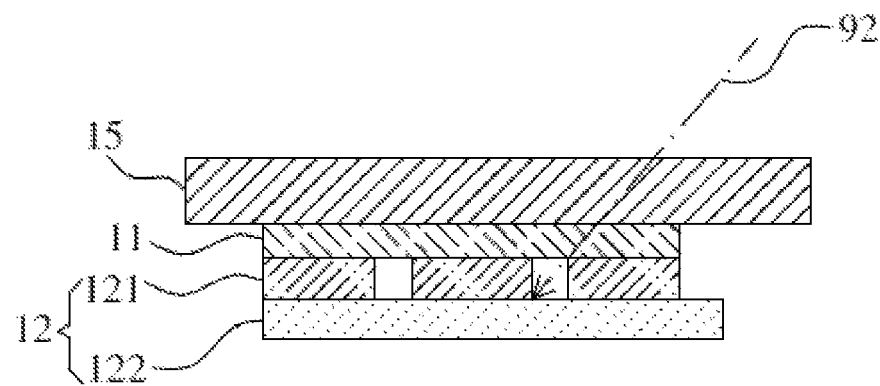
FIG. 6A is a schematic diagram of ambient light identification of a display panel according to an embodiment of the present disclosure.
Figure 6B:
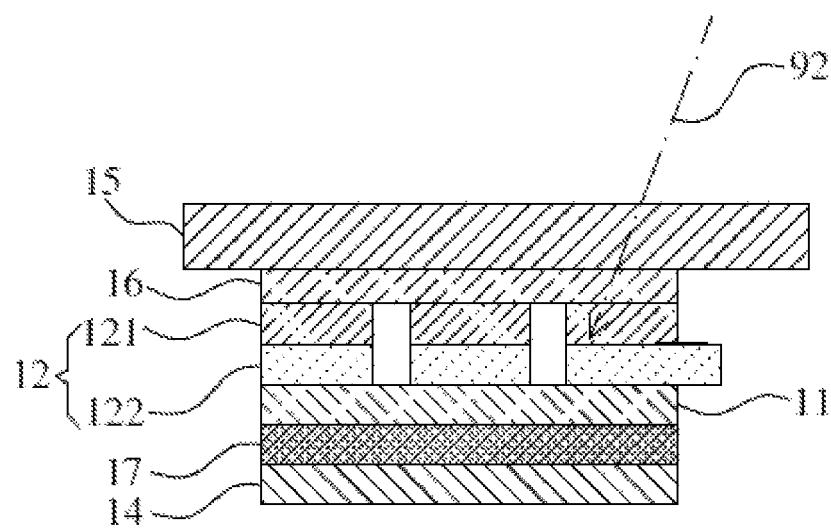
FIG. 6B is a schematic diagram of ambient light identification of a display panel according to another embodiment of the present disclosure.

Referring to FIG. 6A, the display panel is, for example, an OLED panel. An ambient light 92 is received by the TFT photosensitive sensor 112 and converted into an electrical signal. A driving chip (not shown in FIG. 6A) of the photosensitive module is used to convert the electrical signal into ambient light monitoring information. The TFT photosensitive sensor has a characteristic that a magnitude of the current value is proportional to a logarithm of the intensity of the light received. In one example, the driving chip can calculate the ambient light in which the TFT photosensitive sensor is located according to a calibration curve used when the TFT photosensitive sensor is initialized. Then, the driving chip calculates an average value of the light intensity received by all of the TFT photosensitive sensors 112 on an entire surface through an average calculation. Then, a brightness of the screen is adjusted according to the light intensity corresponding to the average value, and an ambient light monitoring function is achieved. On the other hand, when the display panel is, for example, a liquid crystal panel, reference may be made to FIG. 6B.

From above, in the embodiment of the present disclosure, the control method of the display panel mainly converts light into electrical signals through a TFT photosensitive sensor and converts the electrical signals into at least one of fingerprint information, proximity sensing information, and ambient light monitoring information through a driving chip, so as to reduce a production cost and improve an integration of electronic components.

It is noted that, in an embodiment, a number of the light-path units 121 may be multiple, and the plurality of light-path units 121 are disposed with intervals so that light can enter the TFT photosensitive sensor 112 from between the plurality of light-path units 121. In another embodiment, there may be multiple TFT photosensitive sensors 112. For example, a number of the light-path units 121 and the TFT photosensitive sensors 112 are the same, and the light-path units 121 and the TFT photosensitive sensors 112 may be provided in a one-to-one correspondence manner.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

The invention claimed is:

1. A display panel, comprising:
   a display module;
   a photosensitive module disposed on a surface of the display module,
   wherein the photosensitive module comprises:
      a plurality of light-path units disposed with intervals;
      a TFT photosensitive sensor disposed on the plurality of light-path units, wherein the TFT photosensitive sensor receives a light passing through between the plurality of light-path units and converts the light into an electrical signal, wherein the light includes at least one of an ambient light and a reflected light; and
      a driving chip electrically connected to the TFT photosensitive sensor, wherein the driving chip converts the electrical signal into at least one of a fingerprint information, a proximity sensing information, and an ambient light monitoring information;
   an application module electrically connected to the display module and the photosensitive module, wherein the application module provides an action signal to the display module to control the action of the display module, according to at least one of the fingerprint information, the proximity sensing information, and the ambient light monitoring information.

2. The display panel according to claim 1, wherein the display module is a self-luminous panel, wherein an incident light is emitted from the self-luminous panel and is reflected to form the reflected light.

3. The display panel according to claim 1, wherein the display panel further comprises a backlight module disposed on the TFT photosensitive sensor, wherein an incident light is emitted from the backlight module and is reflected to form the reflected light.

4. A display panel, comprising:
   a display module;
   a photosensitive module disposed on a surface of the display module,
   wherein the photosensitive module comprises:
      a light-path unit;
      a TFT photosensitive sensor disposed on the light-path unit, wherein the TFT photosensitive sensor receives a light and converts the light into an electrical signal, wherein the light includes at least one of an ambient light and a reflected light; and
      a driving chip electrically connected to the TFT photosensitive sensor, wherein the driving chip converts the electrical signal into at least one of a fingerprint information, a proximity sensing information, and an ambient light monitoring information;
   an application module electrically connected to the display module and the photosensitive module, wherein the application module provides an action signal to the display module to control the action of the display module, according to at least one of the fingerprint information, the proximity sensing information, and the ambient light monitoring information.

5. The display panel according to claim 4, wherein the display module is a self-luminous panel, wherein an incident light is emitted from the self-luminous panel and is reflected to form the reflected light.

6. The display panel according to claim 4, wherein the display panel further comprises a backlight module disposed on the TFT photosensitive sensor, wherein an incident light is emitted from the backlight module and is reflected to form the reflected light.

7. A control method of a display panel, comprising steps of:
   providing a display panel, wherein the display panel comprises a display module, a photosensitive module, and an application module, wherein the application module is connected with the display module and the photosensitive module;
   receiving a light through a TFT photosensitive sensor of the photosensitive module and converting the light into an electrical signal, wherein the light includes at least one of an ambient light and a reflected light;
   converting the electrical signal into at least one of a fingerprint information, a proximity sensing information, and an ambient light monitoring information through a driving chip of the photosensitive module; and
   providing, by the application module, an action signal to the display module according to at least one of the fingerprint information, the proximity sensing information, and the ambient light monitoring information to control an action of the display module.

8. The control method of the display panel according to claim 7, wherein the display module is a self-luminous panel, wherein an incident light is emitted from the self-luminous panel and is reflected to form the reflected light.

9. The control method of the display panel according to claim 7, wherein the display panel further comprises a backlight module disposed on the TFT photosensitive sensor, wherein an incident light is emitted from the backlight module and is reflected to form the reflected light.

10. The control method of the display panel according to claim 7, wherein the light includes at least one fingerprint valley reflection light and at least one fingerprint crest reflection light, wherein the driving chip converts the electrical signal into the fingerprint information.

11. The control method of the display panel according to claim 7, wherein the light includes the ambient light and the reflected light, and the driving chip converts the electrical signal into the proximity sensing information.

12. The control method of the display panel according to claim 7, wherein the light includes the ambient light, wherein the driving chip converts the electrical signal into the ambient light monitoring information.

13. The control method of the display panel according to claim 7, wherein the driving chip analyzes the light in a time-division manner.

* * * * *